United States Patent
Tseng et al.

(10) Patent No.: US 6,184,092 B1
(45) Date of Patent: Feb. 6, 2001

(54) SELF-ALIGNED CONTACT FOR TRENCH DMOS TRANSISTORS

(75) Inventors: Mao-song Tseng, Hsinchu; Rong-ching Chen, Taichung Shien; Su-wen Chang, Hsinchu Shien; Chin-lin Lin, Hsinchu, all of (TW)

(73) Assignee: Mosel Vitelic Inc., Hsinchu (TW)

( * ) Notice: Under 35 U.S.C. 154(b), the term of this patent shall be extended for 0 days.

(21) Appl. No.: 09/444,988

(22) Filed: Nov. 23, 1999

(51) Int. Cl.[7] .................................................. H01L 21/336
(52) U.S. Cl. ........................ 438/272; 438/361; 438/364
(58) Field of Search .................................. 438/272, 296, 438/714, 696, 339, 361, 364, 513; 437/33, 38, 67, 69, 241; 257/506, 510, 514, 515

(56) References Cited

U.S. PATENT DOCUMENTS

| | | | |
|---|---|---|---|
| 4,728,606 | * 3/1988 | Bukhman et al. | 437/33 |
| 4,835,115 | * 5/1989 | Eklund | 437/38 |
| 5,830,797 | * 11/1998 | Cleeves | 438/296 |
| 5,939,335 | * 8/1999 | Arndt et al. | 438/696 |
| 6,020,621 | * 2/2000 | Wu | 257/506 |

* cited by examiner

Primary Examiner—David Nelms
Assistant Examiner—Phuc T. Dang
(74) Attorney, Agent, or Firm—Bacon & Thomas; Richard E. Fichter

(57) ABSTRACT

A method for forming a self-aligned contact for a trench DMOS transistor comprises: providing a semiconductor substrate; etching a trench into the semiconductor substrate at a selected location on the surface of the semiconductor substrate; forming a first dielectric layer that covers the semiconductor substrate and walls of the trench; forming a plug in the trench, which comprises a step of depositing a semiconductor layer that covers the semiconductor substrate and fills in the trench, and a step of etching the semiconductor layer until the plug is below the trench for about 0.2 to 0.3 micron; forming a second dielectric layer on the plug; and forming a conductive layer over the second dielectric layer and the surface of the semiconductor substrate for ohmic contact regions.

9 Claims, 7 Drawing Sheets

SELF-ALIGNED CONTACT FOR TRENCH DMOS TRANSISTORS

FIELD OF THE INVENTION

The present invention generally relates to MOS (metal oxide semiconductor) transistor devices. Specifically, the present invention relates to trench DMOS (double diffused MOS) transistors in which a self-aligned contact structure allows the contact to be fabricated without defining on a mask.

BACKGROUND OF THE INVENTION

Trench DMOS transistors are widely used in integrated circuits for power transistors. The gate electrode is a conductive material, which located in a trench in the transistor substrate, where the sidewalls and bottom of the trench are insulated with silicon dioxide.

In a typical discrete trench DMOS circuit, several trench DMOS transistors are fabricated in parallel. Therefore, on a typical discrete trench DMOS semiconductor, the trench DMOS devices share a common drain contact (the substrate), their sources are all shorted together with metal, and their gates are shorted together with polysilicon. It is often physically constructed using an array or matrix of smaller transistors all connected in parallel. For a discrete trench DMOS semiconductor, it is desirable to maximize the conductivity per unit area of trench DMOS transistor array when it is turned "on" by the gate.

In order to increase the density of the trench DMOS devices on a chip, it is desirable to minimize the contact size so that adjacent neighboring transistors (trenches) can be fabricated as closely as possible to each trench DMOS transistor pair. However, each masking step requires a mask alignment and therefore results in a possible alignment error, undesirably reducing yield. Expected mask alignment errors can be factored into the device dimensions in order to minimize the adverse affect on yield, but this approach increases the cell dimensions, thereby reducing the density of the trench DMOS transistors on the semiconductor and correspondingly decreasing the conductivity per unit area.

FIGS. 4A–4C schematically show the process flow in forming non-self-aligned contacts of trench DMOS in the prior art. FIG. 4A shows a pair of closely packed trenches 20 and 21 in semiconductor substrate 10. The trench 20 and trench 21 are substantially the same. Inside the trenches 20 and 21, an underlying dielectric layer 31 and a polycrystalline silicon plug 15 are deposited. An (ILD) layer 42 is then deposited over the surface of the semiconductor substrate 10 and trenches 20,21. The ILD layer 42 can be formed by a low temperature oxidation process with material of silicon oxide, tetraethylanthosilicate phospsilicate glass boronophosilicate glass or any combination of above. Then a photolithographic photoresist layer 17 is applied to form contact patterns. After that, as shown in FIG. 4C, ILD layer 42 is etched to expose contact regions 18a to 18c, and a plurality of ILD islands (noted as 32a–32d) stay on semiconductor surface and trenches 20,21.

After stripping off the photoresist layer 17, a conductive metal layer 19 is deposited to cover the ILD islands 32a–32d and those exposed contact regions 18a–18c. However, as mentioned above, the spacing 101 between trench 20 and trench 21 should be designed larger than the necessary contact size in order to compensate for the possible alignment error. Thereby, it is impossible to get the most closely packed devices (trenches 20 and 21) in the prior art process described above.

Since it is generally desirable to reduce the costs of manufacturing trench DMOS devices, it would be desirable to design devices as closely packed as possible. Therefore, under the same condition of the photolithographic resolution and alignment capability, it is desirable to eliminate the ILD islands (32a and 32b) on top of trench 20 and trench 21, respectively, in order to design the smallest spacing 101 between the trench edges of trench 20 and 21.

SUMMARY OF THE INVENTION

It is therefore an object of the present invention to provide a method of fabricating trench DMOS transistors structures with the contact to the transistor's source and body self-aligned to the trench. With a self-aligned contact, the distance from the edge of the source and body contact to the edge of the trench can be minimized. Therefore, the distance between the trench edges, which is the source and body region, can be reduced. As a result, the packing density of the transistors is increased dramatically. This also gives rise to much improved device performance in terms of lower on-resistance and higher current driving capability.

The method for forming a self-aligned contact for trench DMOS transistors, as shown in FIGS. 3A–3D, which includes: providing a semiconductor substrate 10; etching trenches 20 and 21 into the semiconductor substrate 10 at selected locations on the surface of the semiconductor substrate 10, trenches 20 and 21 are substantially the same; forming a first dielectric layer 31 over the sides and bottom of the trenches 20 and 21; forming plugs 32a and 32b inside the trenches 20 and 21, respectively, over the first dielectric layer 31, and the top of the plugs 32a and 32b being below the top of the trenches 20 and 21; forming a second dielectric layer 16 over the top of the plugs (32a, 32b); forming an silicon nitride layer 41 over the second dielectric layer 16 and the semiconductor surface; forming an ILD layer 42 over the silicon nitride layer 41; defining contact patterns to expose pre-selected regions by using photolithographic process; dry etching the ILD/silicon nitride bi-layers to expose pre-selected contact regions 18b–18c and ILD islands 32c–32d; forming a conductive layer 19 over the second dielectric layer 16, ILD islands 32c–32d and the exposed semiconductor surface for ohmic contact regions 18a–13c.

BRIEF DESCRIPTION OF THE DRAWINGS

The above and other objects and the features and effects of the present invention can be best understood by referring to the following detailed description of the preferred embodiment and the accompanying drawings, in which.

DETAILED DESCRIPTION OF THE PREFERRED EMBODIMENTS

Figure 1:
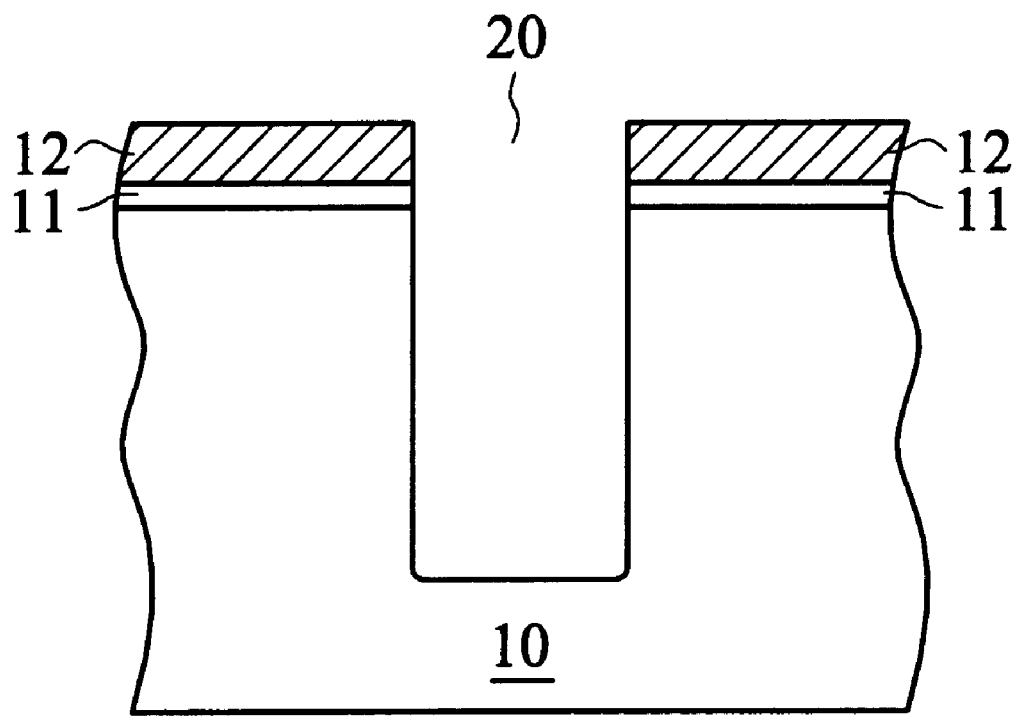
FIG. 1 is a cross-sectional view of an epitaxy silicon substrate (1,0,0) with a masking layer.
Figure 2A:
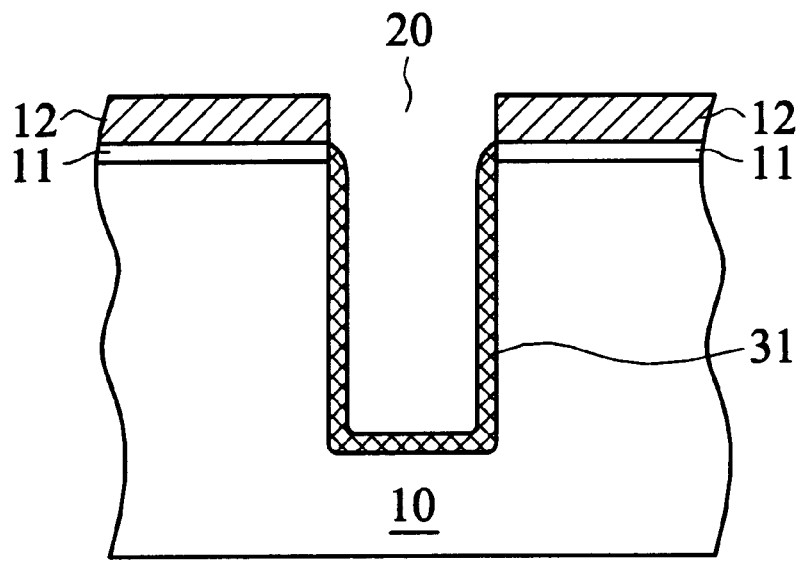
FIGS. 2A–2D schematically show the process flow of forming a trench and the capping oxide therein.

FIG. 1 is a cross-sectional view of an epitaxy silicon substrate (1,0,0) 10 with a masking layer. A masking layer consisting of silicon oxide layer 11 covered by silicon nitride layer 12 is formed according to any one of a number of well-known techniques; for example, silicon oxide layer 11 may be a grown oxide having a nominal thickness in the range of 10 nm to 20 nm, and nitride layer may be deposited by low pressure chemical vapor deposition (LPCVD) to nominally 150 nm to 250 nm thick. Photoresist (not shown) is then used to define the pattern for the trench, and silicon nitride layer 12 and silicon oxide layer 11 are etched to expose a portion of silicon substrate 10 through which a trench 20 in the cell area is etched to the depth of 1.5 to 2.0 microns by way of reactive ion etch (RIE), according to well known trench etch techniques. As shown in FIG. 2A, a high temperature (800° C.–1100° C.) gate oxide layer 31 with a thickness of 150 to 700 Angstroms is grown. Usually, a high temperature sacrificial (linear) oxide layer with a thickness of 300 to 1200 Angstroms is grown and then totally dipped off by the wet etching process to reduce the trench sidewall defects as well as get a smooth trench sidewall before growing layer 31.

Figure 2B:
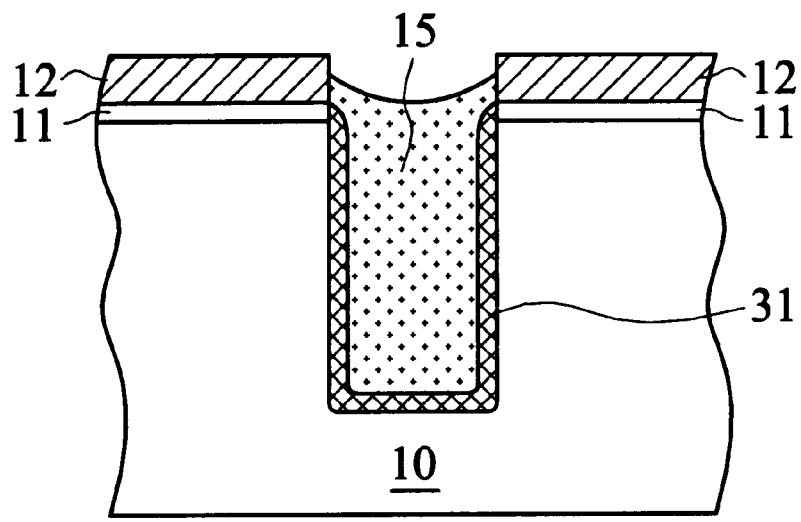

Then, trench 20 is filled with a polycrystalline silicon plug 15, formed by chemical vapor deposition (CVD) of a polycrystalline silicon layer over the entire surface of the semiconductor substrate 10. A planarized etch of the polycrystalline silicon plug 15 is performed and stopped at the surface of the silicon nitride layer 12, then the etch is continued so that the polycrystalline silicon plug 15 inside the trench 20 is recessed to a predetermined depth (e.g. in a range of 0.2 micron to 0.3 micron), as shown in FIG. 2B.

Figure 2C:
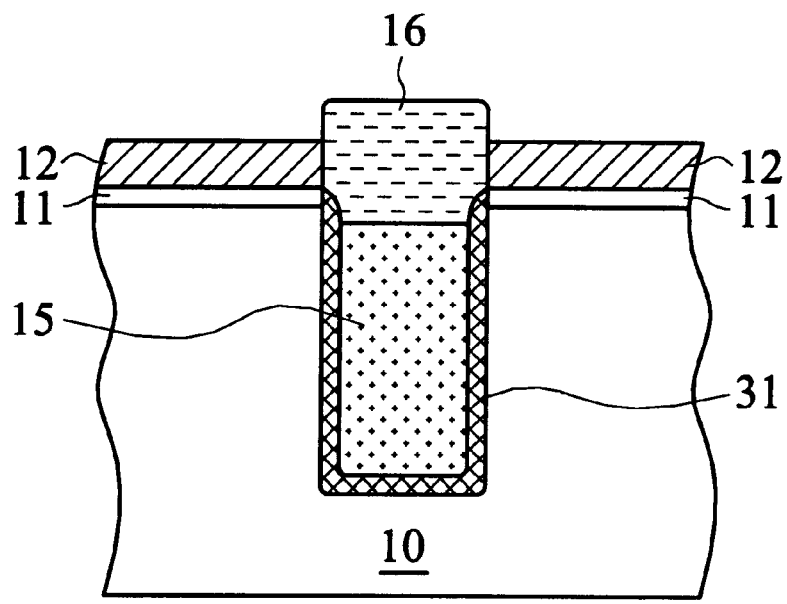
Figure 2D:
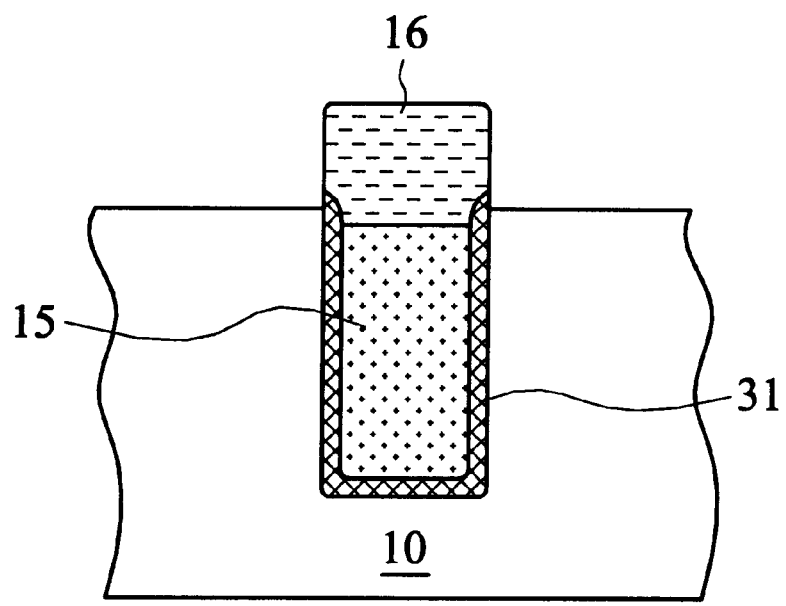

Thereafter, as shown in FIG. 2C, an oxidation step is utilized to form a capping oxide layer 16 on top of the recess by oxidizing the polycrystalline silicon plug 15. The thickness of the capping guide layer 16 is ranged from 2000 to 3000 Angstroms. And this capping oxide layer 16 is used as isolation oxide between the polycrystalline gate 15 inside the trench and metal layer 19 in the cell area for the subsequent processes.

Figure 3A:
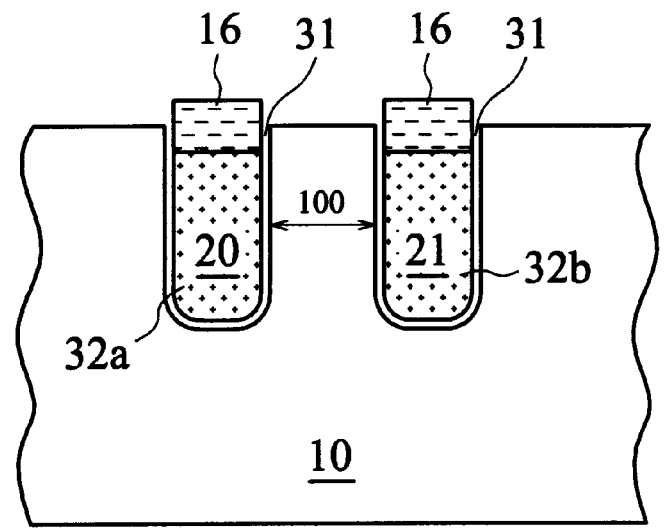
FIGS. 3A–3D schematically show the process flow in forming self-aligned contacts in the present invention.

Accordingly, the masking layers 11 and 12 are stripped off and a pair of adjacent trenches 20 and 21 are shown in FIG. 3A. Trench 21 has substantially the same structure as trench 20.

Figure 3B:
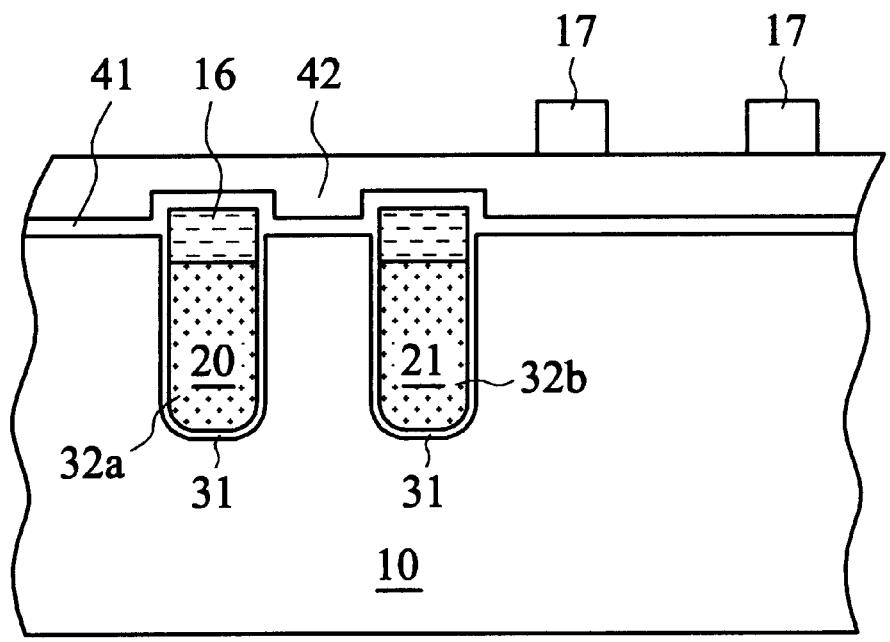

An silicon nitride layer 41 with the thickness of 1000 Angstroms to 1500 Angstroms is deposited over the surface of the semiconductor substrate 10 and the capping oxide layer 16, then an ILD layer 42 is deposited over the silicon nitride layer 41. The ILD layer 42 can be formed by a low temperature oxidation process with material of silicon oxide, TEOS, PSG, BPSG or any combination of above, and the thickness is from 9000 to 12000 Angstroms. The silicon nitride layer 41 can be formed by a plasma enhanced method or other well known low temperature process. Then a photoresist layer 17 and photolithographic processes are applied to expose predetermined contact regions in the non-cell area as shown in FIG. 3B. After that, ILD layer 42/silicon nitride layer 41 bi-layers are etched to expose the predetermined contact regions 18b–18c and ILD islands 32c–32d in the non-cell area.

A two-step dry etching method is used to form these contacts, which includes: (A). oxide dry etching step to stop on the surface of silicon nitride layer 41, which uses a high selectivity recipe with high oxide etching rate with respect to silicon nitride; (B). silicon nitride dry etching step to stop on the surface of the capping oxide layer 16, which uses a high selectivity recipe with high silicon nitride etching rate with respect to silicon oxide.

Figure 3C:
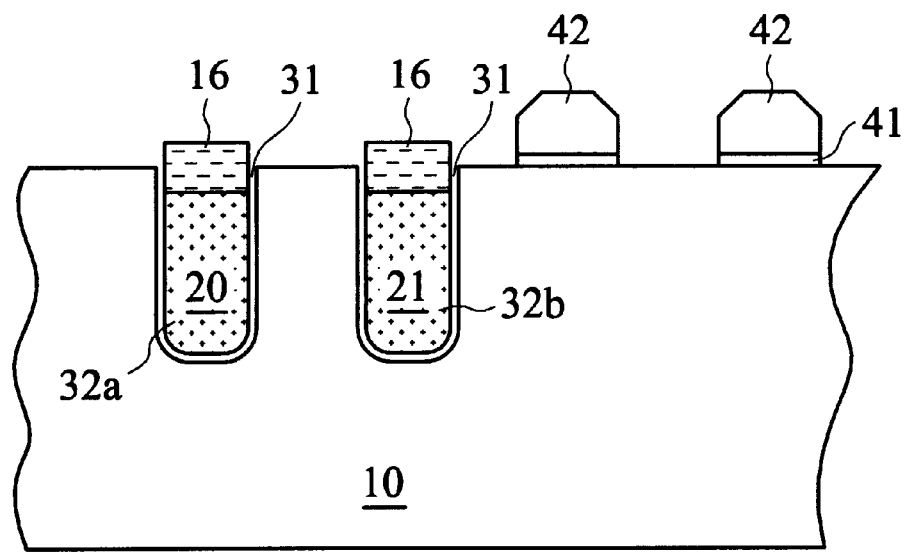
Figure 3D:
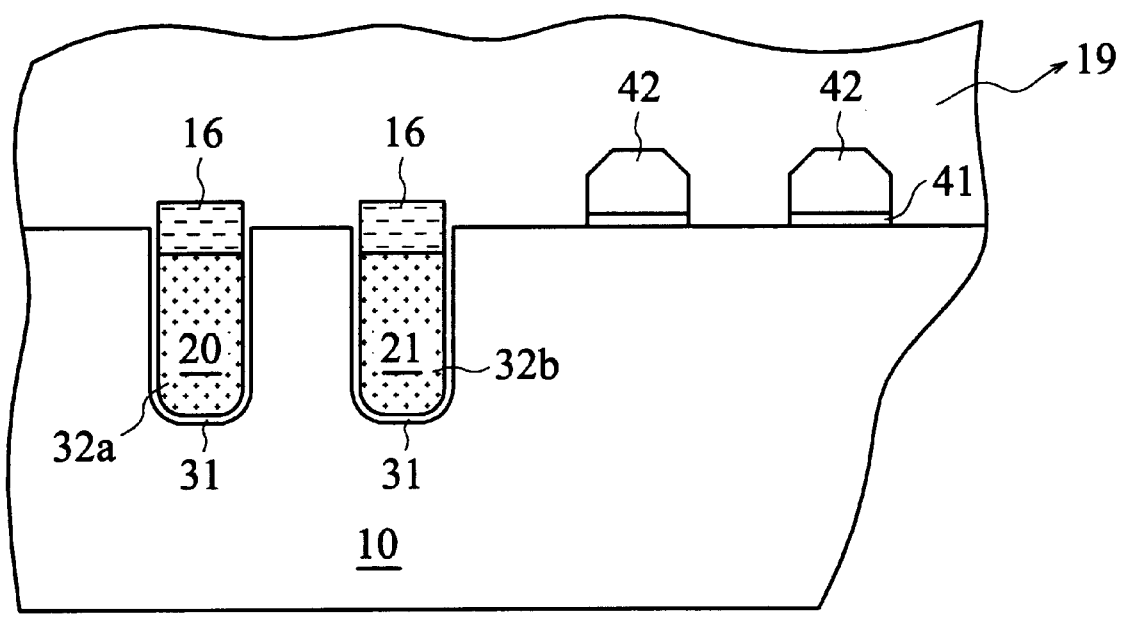
Figure 4A:
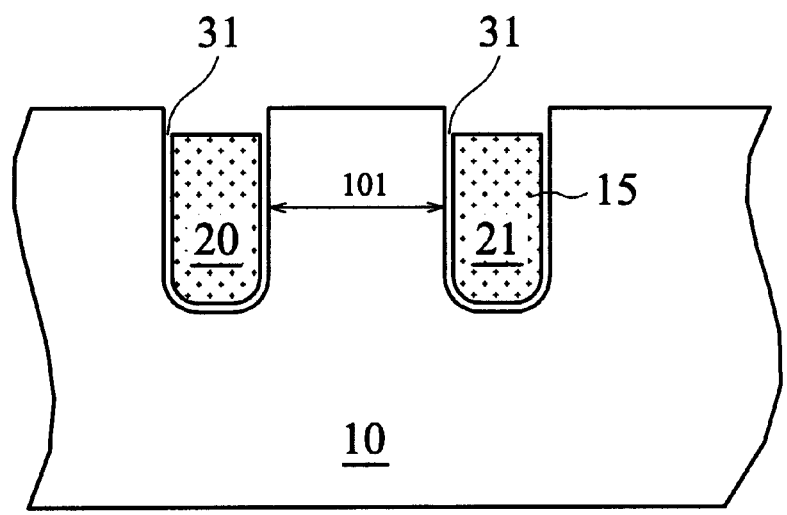
FIGS. 4A–4C schematically show the process flow in forming non-self-aligned contacts in the prior art.
Figure 4B:
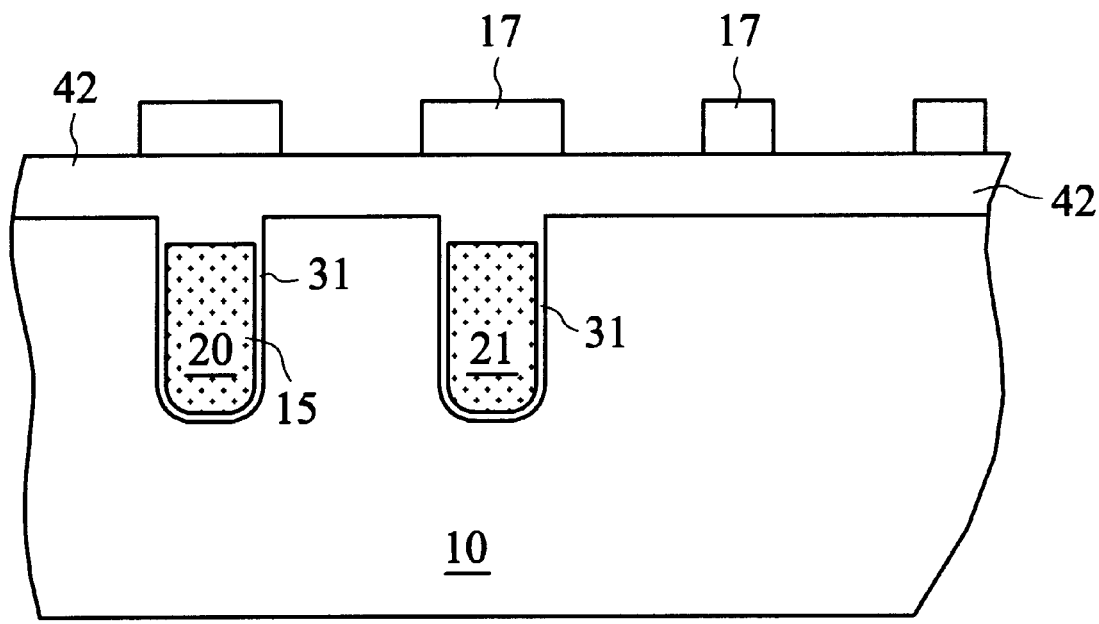
Figure 4C:
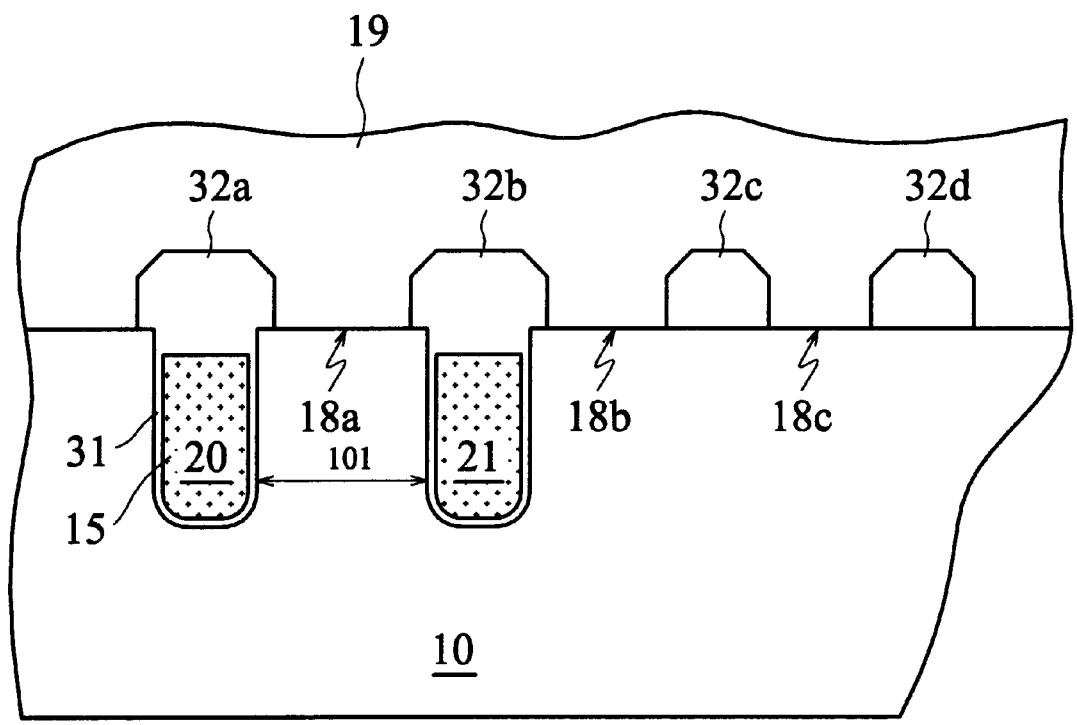

Therefore, the exposed regions of ILD layer 42 are etched away firstly with a high selectivity (oxide to silicon nitride) etching recipe, then it is followed by a silicon nitride etching step with highly selectivity with respect to silicon oxide in order to etch the exposed regions of silicon nitride 41. After stripping off the photoresist layer 17, as shown in FIGS. 3C–3D, a conductive metal layer 19 is deposited to cover the ILD islands 32c–32d, capping oxide layer 16 and those exposed contact regions 18a–18c.

Comparing with the method in the prior art, in the self-aligned contact process, same masking step is used but different contact patterns defined on the photo mask. The contact patterns in the cell area don't need to be defined on a photo mask, therefore, the contact etching therein is substantially processed with blanket dry etching. As a result, in the periphery circuits area, ILD islands 32c–32d and non-self-aligned contacts 18b–18c are formed as the prior art, but in the cell area, contact region 18a is not defined by the photo mask, actually it is self-aligned to the trenches 20 and 21. Also, in the cell area, the capping oxide layer 16 covering the trench is thick enough to be the isolation between the polycrystalline gate and metal layer, e.g. 15 and 19, so it is not necessary to form ILD islands 32a and 32b as the prior art. Therefore, the minimum spacing 100 between trenches 20 and 21 can be designed smaller than the prior art's minimum spacing 101 since there is no more alignment error need to be considered. As a result, the packing density of the transistors (trenches) can be increased dramatically. This can lower the manufacturing cost, and also gives rise to much improved device performance in terms of lower on-resistance and higher current driving capability.

To sum up, there are some characterizations and advantages in the self-aligned contact for trench DMOS transistors in accordance with the invention, 1. The self-aligned process utilizes a two-step dry etching method to form contacts in the cell area, which includes: (A). oxide dry etching step to stop on the surface of silicon nitride layer 41, which uses a high selectivity recipe with high oxide etching rate with respect to silicon nitride; (B). silicon nitride dry etching step to stop on the surface of the capping oxide layer 16, which uses a high selectivity recipe with high silicon nitride etching rate with respect to silicon oxide. In the cell area, the capping layer covering the trench is thick enough to be the isolation between the polycrystalline gate and the metal layer, so it is not necessary to form ILD isolation islands by using photolithographic steps as the prior art.

2. The contact patterns in the cell area don't need to be defined on a photo mask, therefore, the contact etching therein is substantially processed with blanket dry etching and self-aligned to the cell trenches. As a result, the minimum spacing 100 between cell trenches can be designed much smaller than the prior art's minimum spacing 101 since there is no more contact alignment error need to be considered. Therefore, the packing density of the transistors (trenches) can be increased dramatically.

The preferred embodiment described in the above description is only illustrative and is not to be construed as limiting the invention. Various modifications and applications can be made without departing from the true spirit and scope of the invention as defined by the appended claims.

What is claimed is:

1. A method for forming a self-aligned contact for a trench DMOS transistor, comprising:

providing a semiconductor substrate;

etching a trench into said semiconductor substrate at a selected location on the surface of said semiconductor substrate;

forming a first dielectric layer that covers said semiconductor substrate and walls of said trench;

forming a plug in said trench, which comprises a step of depositing a semiconductor layer that covers said semiconductor substrate and fills in said trench, and a step of etching said semiconductor layer until said plug is below said trench for about 0.2 to 0.3 micron;

forming a second dielectric layer on said plug; and forming a conductive layer over said second dielectric layer and said surface of said semiconductor substrate for ohmic contact regions.

2. The method in accordance with claim 1, wherein the step of forming said first dielectric layer comprises:

forming a linear oxide layer with a thickness of approximately 300 to 1200 Angstroms;

stripping off said linear oxide layer by a wet etching process to reduce sidewall defects of said trench and get a smooth trench sidewall; and forming said first dielectric layer.

3. The method in accordance with claim 1, wherein the step of etching said semiconductor layer clears said semiconductor layer from said surface of said semiconductor substrate.

4. A method forforming a self-aligned contact for a trench DMOS transistor, comprising:

providing a semiconductor substrate;

etching a trench into said semiconductor substrate at a selected location on the surface of said semiconductor substrate;

forming a first dielectric layer that covers said semiconductor substrate and walls of said trench;

forming a plug in said trench, wherein said plug is below said trench for about 0.2 to 0.3 micron;

forming a second dielectric layer on said plug, which comprises a step of oxidizing said plug so that said second dielectric layer is formed to fill the portion of said trench from which said plug is recessed;

forming a silicon nitride layer over said second dielectric layer and said surface of said semiconductor substrate;

forming an inter-layer dielectric (ILD) layer over said silicon nitride layer;

patterning said ILD layer and said silicon nitride layer to expose pre-selected regions on said surface of said semiconductor substrate; and forming a conductive layer over said second dielectric layer, remaining portions of said ILD layer, and said surface of said semiconductor substrate for ohmic contact regions.

5. The method in accordance with claim 4, wherein the step of forming said first dielectric layer comprises:

forming a linear oxide layer with a thickness of approximately 300 to 1200 Angstroms;

stripping off said linear oxide layer by a wet etching process to reduce sidewall defects of said trench and get a smooth trench sidewall; and forming said first dielectric layer.

6. The method in accordance with claim 4, wherein said step of forming said plug comprises:

depositing a semiconductor layer that covers said semiconductor substrate and fills in said trench; and etching said semiconductor layer until said plug is below said trench for about 0.2 to 0.3 micron.

7. The method in accordance with claim 6, wherein the step of etching said semiconductor layer clears said semiconductor layer from said surface of said semiconductor substrate.

8. The method in accordance with claim 4, wherein said step of patterning said ILD layer and said silicon nitride layer comprises:

defining a photoresist mask over said ILD layer through photolithographic process;

etching said ILD layer and said silicon nitride layer; and stripping off said photoresist mask.

9. A method forforming a self-aligned contact for a trench DMOS transistor, comprising:

providing a semiconductor substrate;

etching a trench into said semiconductor substrate at a selected location on the surface of said semiconductor substrate;

forming a linear oxide layer with a thickness of approximately 300 to 1200 Angstroms;

stripping off said linear oxide layer by a wet etching process to reduce sidewall defects of said trench and get a smooth trench sidewall;

forming a plug in said trench, wherein said plug is below said trench for about 0.2 to 0.3 micron;

forming a second dielectric layer on said plug, which comprises a step of oxidizing said plug so that said second dielectric layer is formed to fill the portion of said trench from which said plug is recessed;

forming a silicon nitride layer over said second dielectric layer and said surface of said semiconductor substrate;

forming an ILD layer over said silicon nitride layer;

patterning said ILD layer and said silicon nitride layer to expose pre-selected regions on said surface of said semiconductor substrate; and forming a conductive layer over said second dielectric layer, remaining portions of said ILD layer, and said surface of said semiconductor substrate for ohmic contact regions.

* * * * *